United States Patent [19]

Momura

[11] Patent Number: 4,906,970
[45] Date of Patent: Mar. 6, 1990

[54] VEHICLE ON-BOARD DIAGNOSING SYSTEM

[75] Inventor: Hiroyuki Momura, Fujisawa, Japan

[73] Assignee: Nissan Motor Co., Ltd., Yokohama, Japan

[21] Appl. No.: 388,315

[22] Filed: Aug. 1, 1989

Related U.S. Application Data

[63] Continuation of Ser. No. 78,391, Jul. 22, 1987, abandoned.

[30] Foreign Application Priority Data

Jul. 23, 1986 [JP] Japan .................................. 61-171826

[51] Int. Cl.⁴ .......................... B60Q 1/00; G06F 15/50
[52] U.S. Cl. ...................................... 340/459; 340/438; 340/461; 340/517; 340/525; 364/424.03
[58] Field of Search ............... 340/459, 461, 462, 438, 340/439, 517, 521, 525; 364/550, 442, 424.03, 424.04, 551.01

[56] References Cited

U.S. PATENT DOCUMENTS

| | | |
|---|---|---|
| 4,317,106 | 2/1982 | Hüber ................................ 340/52 F |
| 4,442,424 | 4/1984 | Shirasaki et al. ................... 340/52 F |
| 4,481,585 | 11/1984 | Huntzinger et al. .............. 340/52 F |
| 4,497,057 | 1/1985 | Kato et al. ......................... 340/52 F |
| 4,630,043 | 12/1986 | Haubner et al. ..................... 364/424 |
| 4,677,429 | 6/1987 | Glotzbach ........................... 364/424 |

*Primary Examiner*—Donnie L. Crosland
*Attorney, Agent, or Firm*—Lowe, Price, LeBlanc, Becker & Shur

[57] ABSTRACT

A vehicle on-board diagnosing system having a display, a plurality of units operatively connected to a plurality of systems to be diagnosed, and a system selecting device which is constructed and arranged such as to select one of the plurality of units and connect same to the display to allow delivery of data from the subject unit to the display.

1 Claim, 3 Drawing Sheets

VEHICLE ON-BOARD DIAGNOSING SYSTEM

This application is a continuation of application Ser. No. 07/078,391, filed July 22, 1987, now abandoned.

BACKGROUND OF THE INVENTION

The present invention relates to a vehicle on-board diagnosing system and more particularly to a system which includes a group of units for diagnosing a plurality of systems, respectively, and a display operatively coupled with the units so as to inform the results of diagnosis.

There is known a vehicle on-board diagnosing system as illustrated in FIG. 3. 21 designates a display unit which informs the result of diagnosis. With a harness 6, the display unit 21 is connected to the units 2, 3, 4, and 5 for diagnosing systems, respectively. The systems represent, for example, an anti-skid control system, a transmission control system, an engine control system, and etc. The display unit 21 is connected to each of the units 2, 3, 4, and 5 via two signal lines, one of which is a data line for delivering data indicating result of diagnosis made at the corresponding unit and the other of which is an activating mode instruction line. Also included by the display unit 21 are a data input processing circuit 31 and an activating switch 32. With the activating switch 32, the data processing circuit 31 selects one of the units 2, 3, 4, and 5. The display unit 21 further includes a data discrimating circuit 33 which discriminates a system being under diagnosis and an activating mode based on the data coming out of the data input processing circuit 31. An output signal of the discriminating circuit 33 is supplied to a display control circuit 34. The display control circuit 34 is operatively connected with a display 16 to control the latter. A display check switch 35 is operatively connected with the display panel 16. Telecommunication self-check, trouble check, input/output system check are examples of the activating mode.

Since, according to this known diagnosing system, the units 2, 3, 4, and 5 are connected to the data input processing circuit 31 of the display unit 21 via different signal lines, respectively, the display unit 21 must be designed taking into account the number at the control units so that the display 21 cannot cope with the situation where a new control unit is to be added. Thus, it is necessary to prepare different displays for different types and grade of, vehicles. Furthermore, since the control units 2, 3, 4, and 5 arranged at different locations of a vehicle are directly connected to the display 21 mounted within a cabin of the vehicle via different signal lines, the total length of the signal lines increase considerably if the number of the signal lines increases, presenting a problem on reliability and economy.

SUMMARY OF THE INVENTION

An object at the present invention is to improve a diagnosing system such that a connection between a display unit and a group of units connected to systems being under diagnosis has been simplified.

According to one embodiment of the present invention, a vehicle on-board diagnosing system, comprises a display, a plurality of units operatively connected to a plurality of systems to be diagnosed, and a system selecting device which is constructed and arranged such as to select one of the plurality of units and connect same to the display to allow delivery of data from the subject unit to the display.

DESCRIPTION OF THE EMBODIMENT

Figure 1:
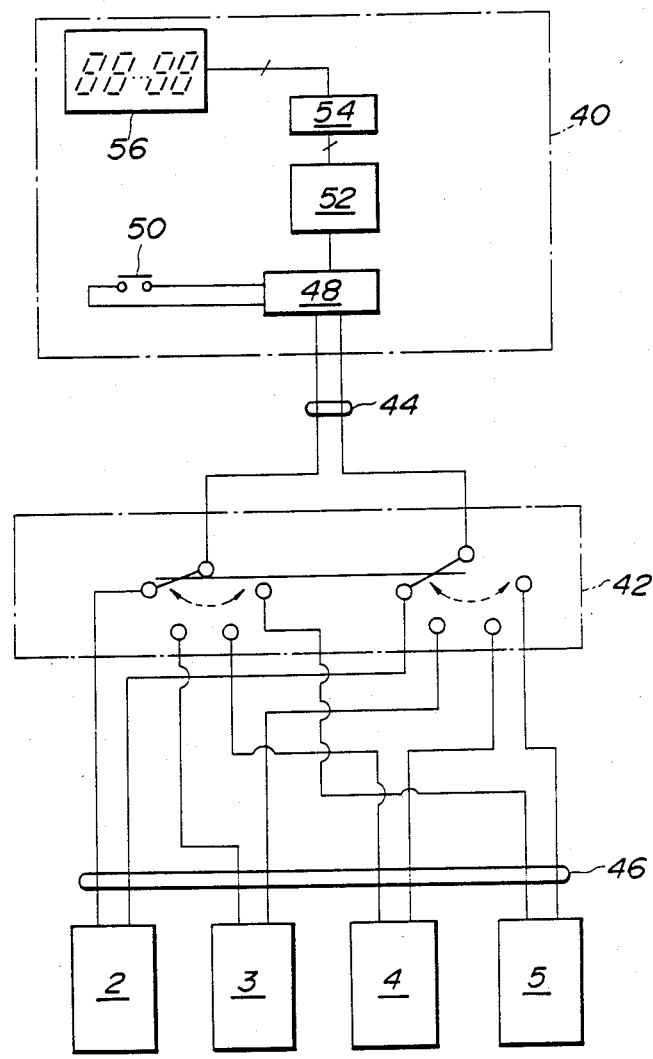
FIG. 1 is a schematic block diagram of an embodiment of a vehicle on-board diagnosing system according to the present invention.
Figure 2:
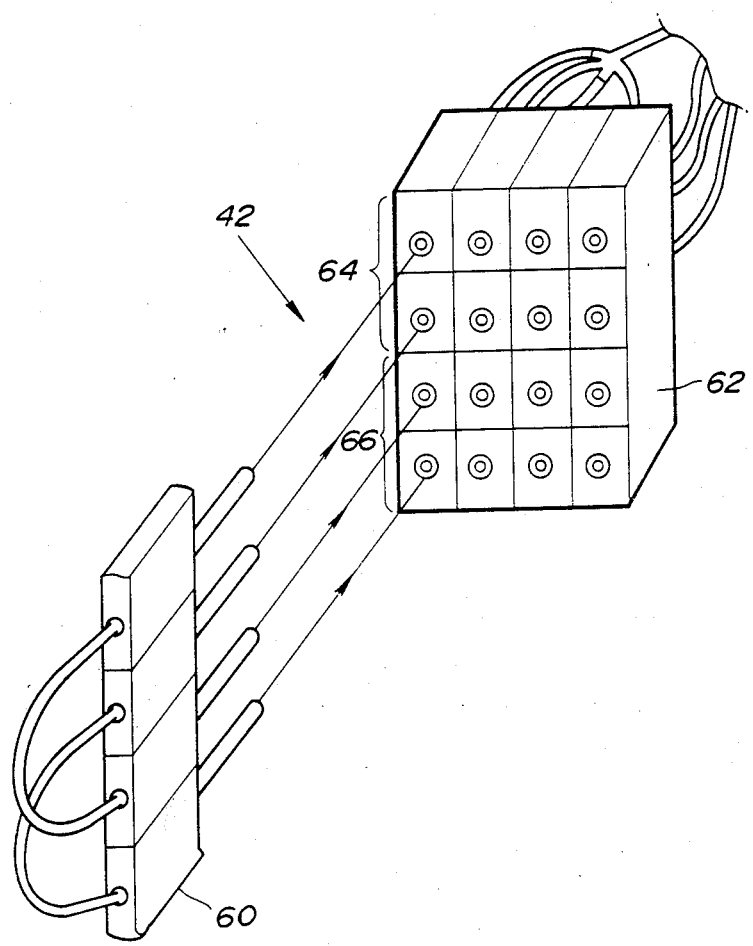
FIG. 2 is a perspective elevational view of a portion of the diangosing system.
Figure 3:
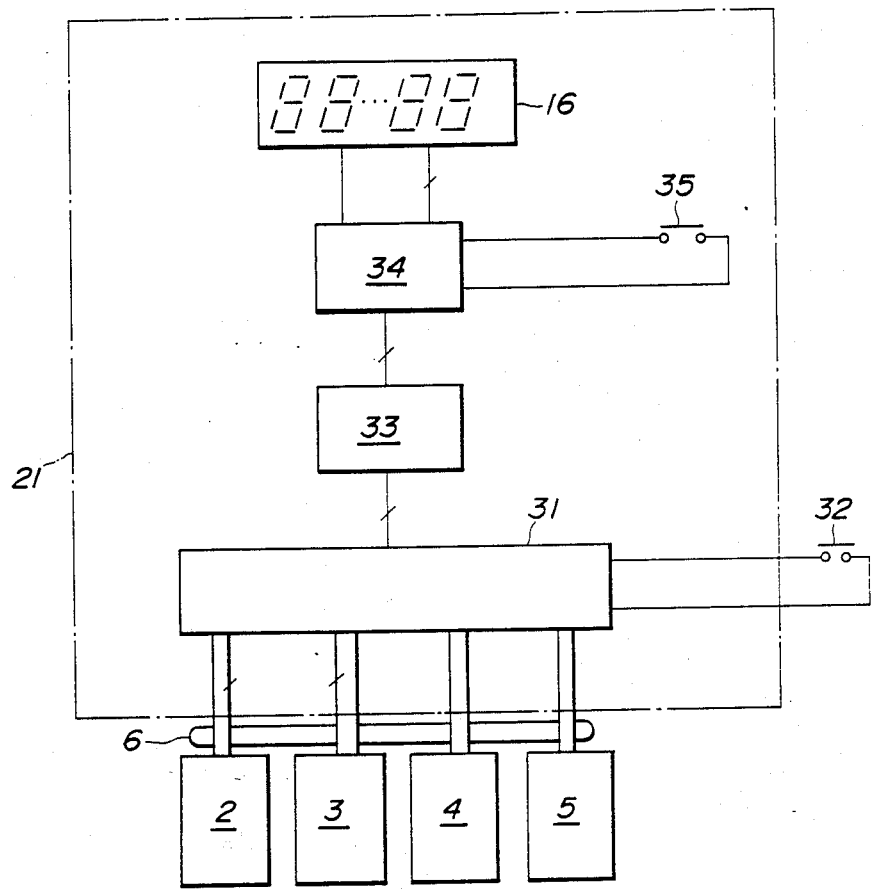
FIG. 3 is a schematic block diagram of a prior art vehicle on-board diagnosing system discussed above.

The same reference numerals are used through FIGS. 1, 2 and 3 to designate like parts.

Referring to FIG. 1, the reference numeral 40 designates generally a display unit. This display unit 40 is connected to a system selecting device 42 via a harness 44. This device 42 in turn is connected via a harness 46 to units 2, 3, 4, and 5 which are connected to systems to be diagnosed.

The harness 44 having one end directly connected to the display unit 40 is made up of two signal lines, one of which is a data line for delivering data indicating result of diagnosis made at the corresponding unit and the other of which is an activating mode instruction line. The display unit 40 includes a data input processing circuit 48 associated with a diagnostic mode switch 50, which, when closed, causes the data input processing circuit 48 to select an appropriate activation and diagnostic mode. Also included are a data discrimination circuit 52, a display control circuit 54, and a display 56. The data discrimination circuit 52 discriminates a subject system being diagnosed and a subject diagnostic mode based on an output signal coming from the data input processing circuit 48. An output signal of the discrimination circuit 52 is supplied to the display control circuit 54 which, based on the signal supplied thereto, supplies instructions to the display 56.

The system selecting device 42 functions to select one of the units 2, 3, 4, and 5 which is connected to a subject system to be diagnosed and to connect same to the display unit 40. This device 42 is more specifically described referring to FIG. 2.

As shown in FIG. 2, the device 42 is a connector made up of two parts 60 and 62, one connector part 60 being in the form of an electric terminal having four poles, the other connector part 62 being in the form an electric terminal equipped with four columns of pole receiving receptacles, each column including four pole receving receptacles. The number of columns correspond to the number of units 2, 3, 4, and 5. Since, in this embodiment, four systems are being diagnosed, four columns are prepared. As will be understood from FIG. 2, the female terminals of each column are divided into two groups 64 and 66, each group consisting of two pole receiving receptacles. The pole receiving receptacles belonging to the group 64 are connected to the display unit 40, whereas the columns of the pole receiving terminals belonging to the group 66 are connected to the units 2, 3, 4 and 5, respectively. In order to connect one set of two pole receiving receptacles of any selected one of the columns and belonging to the group 66 to a corresponding set of two pole receiving receptacles of the same column and belonging to the group 64, the four poles of the connector part 44 are connected by cables. In this embodiment, the top pole is connected to the third pole counted from the top, and the second pole counted from the top is connected to the bottom pole.

In order to activate the diagnosing system according to the present invention, the connector part 60 is coupled with the other connector part 62 with its poles inserted into one of the columns of connector part 62 which are connected to that unit 2 or 3 or 4 or 5 which is in turn connected to a subject system to be diagnosed. With the mode switch 50, a desired diagnostic mode is selected. Then, the data resulting from diagnosis is delivered from the unit selected to the data input processing circuit 48 where the data is processed in accordance with the subject system being diagnosed and the diagnostic mode selected by the mode switch 50. Output signal of the data input processing circuit 48 is supplied via the data discriminator circuit 52 to the display data control circuit 54. In the data discriminator circuit 52, the subject system being diagnosed and the mode selected are discriminated. The display control circuit 54 causes the display 56 to inform the result of diagnosis.

Since, according to the present invention, a single display unit is selectively connectable via a system selecting device to any desired one of units connected to systems under diagnosis, the number of signal lines necessary for connection between the display unit and the system selecting device has been reduced. Thus, the length of signal lines can be reduced. Economical and reliable on board monitoring system thus is provided.

What is claimed is:

1. A vehicle on-board diagnosing system in a vehicle having a plurality of systems to be diagnosed, the vehicle on-board diagnosing system comprising:
 a plurality of units operatively connected to the plurality of systems to be diagnosed, each having at least one signal line for delivering a result of diagnosis;
 a display unit having at least one signal input, said display unit including means for displaying information derived from said signal input; and
 a selecting device including a first connector part having mounted thereon a plurality of columns of electric terminals, each of said columns corresponding to one unit of said plurality of units and each of said columns including a pair of terminals electrically connected to one of said units and a second pair of terminals connected to said signal input of said display unit, including a second connector part having a column of terminals selectively and mateably engageable with each of said columns of terminals in said first connector part, pairs of terminals in said second connector part being connected together so that mating engagement of the terminals in said first connector part with the terminals in said second connector part establishes connection between a pair of terminals in one of said columns in said first connector part corresponding to one of said plurality of units and a pair of terminals in the same column connected to said signal input of said display unit, whereby said second connector part may be selectively mateably engaged with selected columns of terminals in said first connector part.

* * * * *

UNITED STATES PATENT AND TRADEMARK OFFICE
CERTIFICATE OF CORRECTION

PATENT NO. :   4,906,970

DATED      :   March 6, 1990

INVENTOR(S) :  Hiroyuki NOMURA

It is certified that error appears in the above-identified patent and that said Letters Patent is hereby corrected as shown below:

Title page:

Please correct the spelling of the inventor's name as follows:

Hiroyuki Nomura

Signed and Sealed this

Twenty-third Day of April, 1991

*Attest:*

HARRY F. MANBECK, JR.

*Attesting Officer*   *Commissioner of Patents and Trademarks*